United States Patent [19]

Akatsuka

[11] 4,337,525

[45] Jun. 29, 1982

[54] ASYNCHRONOUS CIRCUIT RESPONSIVE TO CHANGES IN LOGIC LEVEL

[75] Inventor: Yasuo Akatsuka, Tokyo, Japan

[73] Assignee: Nippon Electric Co., Ltd., Tokyo, Japan

[21] Appl. No.: 139,595

[22] Filed: Apr. 11, 1980

[30] Foreign Application Priority Data

Apr. 17, 1979 [JP] Japan .................................. 54-46848
Nov. 7, 1979 [JP] Japan ................................ 54-144178
Nov. 8, 1979 [JP] Japan ................................ 54-144693
Nov. 8, 1979 [JP] Japan ................................ 54-144694

[51] Int. Cl.$^3$ .............................................. G11C 8/00
[52] U.S. Cl. ..................................... 365/233; 307/464
[58] Field of Search ................. 365/230, 233; 307/464

[56] References Cited

FOREIGN PATENT DOCUMENTS 55-4735 1/1980 Japan ................................... 365/233
55-28542 2/1980 Japan ................................... 365/233

OTHER PUBLICATIONS

Hultman, "Memory Clock Design", IBM Tech. Disc. Bul., vol. 9, No. 10, 3/67, pp. 1328–1329.
Boudon et al., "Device for Suppressing the Clock Control in a Memory Using SGPL Cells", IBM Tech. Disc. Bul., vol. 21, No. 6, 11/78, pp. 2367–2368.

Primary Examiner—Stuart N. Hecker
Attorney, Agent, or Firm—Laff, Whitesel, Conte & Saret

[57] ABSTRACT

An integrated circuit operable with low power consumption and high reliability is disclosed. The circuit comprises a logic circuit receiving an input logic signal at its input, detection means for detecting a change in the logic input signal, means responsive to an output of detection means for producing a control signal, and control means responsive to the control signal for setting the logic circuit at a predetermined condition irrespective of the input logic signal.

10 Claims, 18 Drawing Figures

ASYNCHRONOUS CIRCUIT RESPONSIVE TO CHANGES IN LOGIC LEVEL

The present invention relates to an integrated circuit, and more particularly to a memory device fabricated as a semiconductor integrated circuit (IC memory).

IC memories are generally classified into the so-called synchronous type memories in which various functional circuits therein such as decoders, sense amplifiers, input/output circuits, etc. are controlled by clock signals, and the so-called asynchronous type memories which does not receive a clock signal and can operate without undergoing any restriction in time, replying only upon input signals such as address information and the like. Although the synchronous type memories are more excellent than the asynchronous type memories with respect to a speed-power product which is normally used as a figure of merit for representing a performance, they necessitate external terminals for receiving clock signals which imposes large restriction upon practical design of ICs, as well as increase in the number of external terminals caused by enhancement of a memory capacity. Moreover, in the synchronous memory, there exists restriction in timing between input data and clock signals since input data such as address information, write information, etc. are introduced into the interior of the IC memory in synchronism with the clock signals in any way. This means that even if address information is fed to the IC memory asynchronously with a clock signal, for instance, the address information will be not accepted at all by the memory and thus will become ineffective. Accordingly, the synchronous type memories have a disadvantage that they are inconvenient for use.

On the other hand, in an asynchronous type memory, input data such as address information can be accepted at any arbitrary time and immediately introduced into the interior of the memory at the time point of acceptance to achieve the operation corresponding to the input data, and therefore, it is easy for use. However, in the asynchronous type memory every functional circuit is always in an operating condition, and hence it has a disadvantage that always large power is dissipated therein.

Above arguments between the synchronous type memory and the asynchronous type memory can be similarly expanded to general integrated circuits which are classified into a synchronous type logic integrated circuit such as a dynamic type logic integrated circuit and a asynchronous type logic integrated circuit such as a static type logic integrated circuit. In this expansion of arguments, the synchronous type logic integrated circuit has substantially the same advantage and the same disadvantage as those of the synchronous type memory while the asynchronous type logic integrated circuit has substantially the same advantage and the same disadvantage as those of the asynchronous type memory. Furthermore, in the asynchronous type logic integrated circuit in which a plurality stage of logic circuit are coupled in cascade, a non-logic level which cannot be classified into any one of rated two logic levels i.e. logic "1" and logic "0" levels inevitably appears at an output of a first stage of logic circuit during a transient time when an input changes in logic level. Such a non-logic level is directly transferred to the succeeding stages of logic circuits and hence the final stage of the logic circuit frequently produces an erroneous output.

Therefore, it is one object of the present invention to provide a memory device which incorporates only the merit of the asynchronous type memories and only the merit of the synchronous type memories in combination.

Another object of the present invention is to provide a memory device which has a reduced number of terminals and less power dissipation.

Still another object of the present invention is to provide an integrated circuit operable with high-reliability.

An integrated circuit according to the present invention comprises a logic circuit receiving logic input signal at its input, means for detecting a change in the input signal from one logic level to the other logic level or non-logic level of the input signal not falling into either of binary logic levels to produce a control signal, and means responsive to the control signal for resetting the logic state of the logic circuit.

According to one aspect of the present invention, there is provided a memory device in which a clock signal (an internal clock signal) is generated inside the memory device without receiving a clock signal from the outside, and the internal clock signal is generated only when logic change has occurred in at least one address input.

According to another aspect of the present invention, there is provided a memory device comprising means for detecting logic change in address inputs information, and means for generating an internal clock signal only when logic change has occurred in the address input information.

According to still another aspect of the present invention there is provided an above-featured memory device in which the detecting means is composed of delay circuits for delaying the respective address inputs and Exclusive OR circuits each having one of the address inputs applied to its first input and the output of the corresponding delay circuit applied to its second input, and the internal clock signal generating means is composed of a multi-input flip-flop circuit having a reset terminal which has the respective outputs of the Exclusive OR circuits applied to its inputs.

The integrated circuit according to the present invention can reduce the number of external terminals because it does not necessitate to receive clock signals externally.

In the integrated circuit such as memory device according to the present invention, input data are not introduced in synchronism with a clock signal as is the case with the synchronous type memory in the prior art, but in response to change in the input data itself, that is, in response to new demand for access, a control signal for executing the demand for access is generated within the circuit. Consequently, input data can be accepted to any arbitrary time, and also less power dissipation can be realized.

Now the invention will be described in greater detail with reference to the accompanying drawings.

Now a first preferred embodiment of the present invention will be described with reference to FIGS. 1 to 3.

Figure 1:
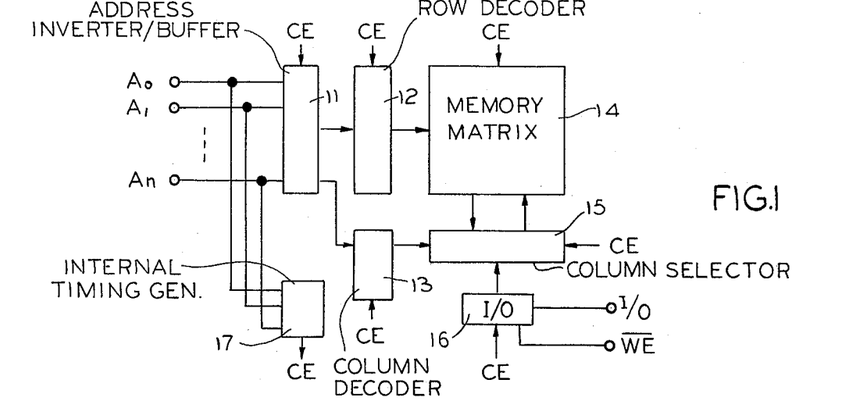
FIG. 1 is a block diagram showing a memory device according to a first preferred embodiment of the present invention.

A basic structure of the memory device according to the present invention is illustrated in FIG. 1. In this figure, a plural bits of address inputs $A_0$ to $A_n$ are applied to an address inverter/buffer 11, which generates true and complementary address signals for the respective address inputs $A_0$ to $A_n$, a part of the address signals are fed to a row decoder 12, and the remainder of the address signals are fed to a column decoder 13. In response to the address signals, the row decoder 12 brings one of word lines in a memory cell matrix 14 to a selection level, while the column decoder 13 responds to the address signals to control a column selection circuit so as to selectively supply data on one digit line or one pair of digit lines in the memory cell matrix 14 to an input/output circuit 16. The data selected by the selection circuit 15 are output via the input/output circuit 16 to an input/output terminal I/O. The input/output circuit 16 is brought into a read condition in response to a high level at a read/write control terminal $\overline{WE}$, and is brought into a write condition in response to a low level at the read/write control terminal $\overline{WE}$. The above-mentioned component parts are constructed in the well-known manner. According to the present invention, there is provided an internal clock generator circuit 17 which generates an internal clock signal CE when the address inputs $A_0$ to $A_n$ are applied thereto and then change has occurred in the address information represented by the address inputs $A_0$ to $A_n$. An enable control signal CE is fed to respective functional circuits such as the address inverter buffer circuit 11 and the like to control their operations. The respective functional circuits are enabled by a high level of the enable control signal CE.

Figure 2:
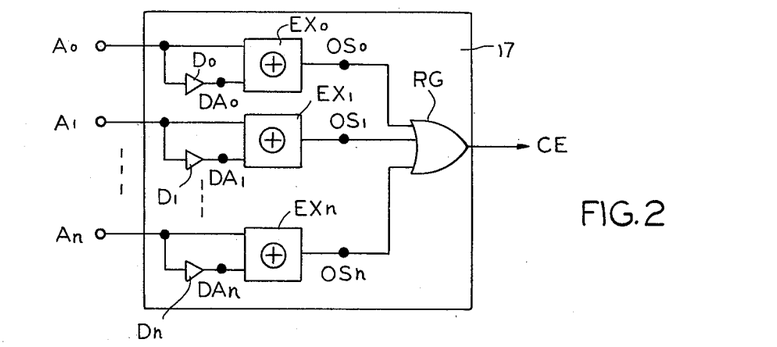
FIG. 2 is a block diagram showing one example of an internal clock generator circuit that is available in the preferred embodiment shown in FIG. 1.
Figure 3:
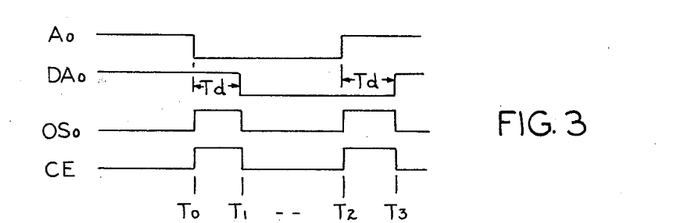
FIG. 3 is a waveform diagram showing the operations of the circuit in FIG. 2.

One example of the internal clock generator circuit 17 is illustrated in FIG. 2. As shown in this figure, the signals appearing on the respective address input terminals $A_0$ to $A_n$ are respectively directly fed to one input terminals of corresponding Exclusive OR gates $EX_0$ to $EX_n$, and also the signals on the respective address input terminals $A_0$ to $A_n$ are respectively passed through delay circuits $D_0$ to $D_n$ and then fed to the other input terminals of the corresponding Exclusive OR gates $EX_0$ to $EX_n$. Outputs $OS_0$ to $OS_n$ of the respective Exclusive OR gates are input to an OR gate RG, and thus an internal clock signal CE is output from the OR gate RG.

The operation of the internal timing generator circuit 17 will be explained with reference to FIG. 3. Here, by way of example, let us assume that among the address inputs $A_0$ to $A_n$, one address $A_0$ has made logic change. When the address $A_0$ makes logic change at time point $T_0$, the Exclusive OR gate $EX_0$ maintains a high level at its output for a period $T_0$ until time point $T_1$, because a delayed address signal $DA_0$ for the address $A_0$ does not follow the above logic change for a period corresponding to a delay time $T_d$ of the delay circuit $D_0$. This high level output $OS_0$ is output as an internal clock signal CE via the OR gate RG. After the time point $T_1$, the delayed address $DA_0$ takes the same logic level as the address $A_0$, so that the output $OS_0$ of the Exclusive OR gate $EX_0$ becomes a low level. Then, after the level of the address $A_0$ has returned to a high level at time point $T_2$, again incoincidence between the address $A_0$ and the delayed address $DA_0$ occurs for the delay time $T_d$ of the delay circuit $D_0$ until time $T_3$, so that the output $OS_0$ of the Exclusive OR gate $EX_0$ becomes high level and thus it is output as an internal clock signal CE at a high level.

As described above, according to the present invention, advantages are obtained that since a clock input terminal need not be provided, the number of terminals can be reduced, and that since internal clock signals are generated only upon access, that is, only when an address is changed, a power dissipation can be greatly reduced.

It is to be noted that the pulse width of the above-described internal clock signal CE can be arbitrarily preset depending upon the delay characteristics of the delay circuits $D_0$ to $D_n$. In addition, the delay circuits $D_0$ to $D_n$ can be designed without any restriction, for instance, by making use of inverter circuits on the like.

Next, another example of the internal clock generator circuit 17 to be used according to the present invention will be described with reference to FIGS. 4 and 5.

Figure 4:
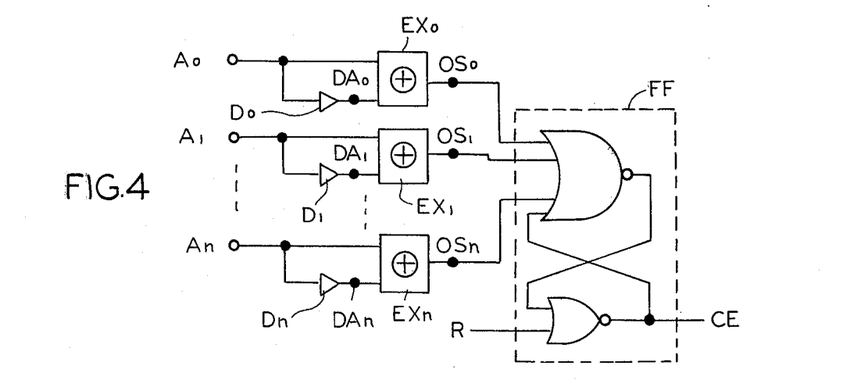
FIG. 4 is a block diagram showing another example of an internal clock generator circuit that is available in the preferred embodiment shown in FIG. 1.
Figure 5:
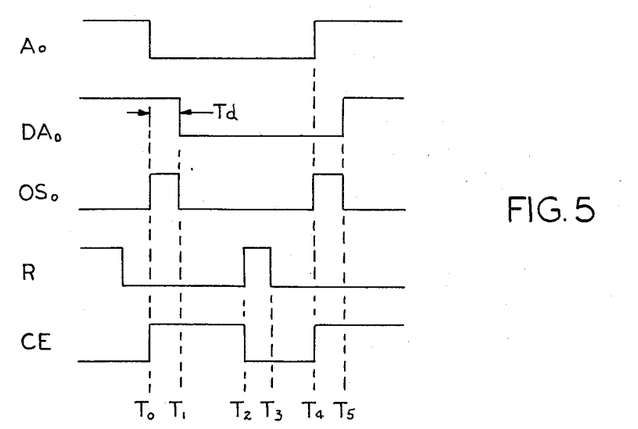
FIG. 5 is a waveform diagram showing the operations of the circuit in FIG. 4.

In FIG. 4, address inputs $A_0, A_1, \ldots, A_n$ are supplied to input terminals of delay circuits $D_0, D_1, \ldots, D_n$, respectively, and respective first inputs of Exclusive OR circuits $EX_0, EX_1, \ldots, EX_n$. Output terminals $DA_0, DA_1, \ldots, DA_n$ of the delay circuits $D_0, D_1, \ldots, D_n$ are respectively connected to respective second inputs of the Exclusive OR circuits $EX_0, EX_1, \ldots, Ex_n$. Outputs $OS_0, OS_1, \ldots, OS_n$ of the Exclusive OR circuits $EX_0, EX_1, \ldots, EX_n$ are led to respective input terminals of an (n+1) input flip-flop circuit FF having a reset terminal R. To the reset terminal R of the flip-flop FF is fed a reset signal which is generated when it is detected that in the memory circuit read-out corresponding to the changed address has been achieved.

Now, one example of the operation of the internal clock generator circuit shown in FIG. 4 will be described with reference to FIG. 5. At time point $T_0$, if the address input $A_0$ changes from logic "1" to logic "0", then the output $OS_0$ of the Exclusive OR circuit $EX_0$ changes from "0" to "1", so that the output CE of the flip-flop circuit FF changes from "0" to "1". When the output $DA_0$, of the delay circuit $D_0$ changes from "1" to "0" at time point $T_1$, the output $OS_0$ of the exclusive OR circuit $EX_0$ changes from "1" to "0", but the output CE of the flip-flop FF still remain at "1" because the output CE has been already latched in the flip-flop FF. At time point $T_2$, if a reset signal R changes from "0" to "1" in response to completion of the read operation based on the changed address information, then the flip-flop FF is turned to its reset condition, and hence the output CE changes from "1" to "0". In the case where the address input $A_0$ changes from "0" to "1" at time point $T_4$ also, a similar operation for next access to the above-described operation will be effected, and thus the output CE will change again from "0" to "1".

While description has been made above on the operation where only the address input $A_0$ changes in logic level, it is obvious that a similar operation will be effected also where more than one address inputs have changed in logic level.

In the followings, a second preferred embodiment of the present invention will be described with reference to FIGS. 6 to 11.

Figure 6:
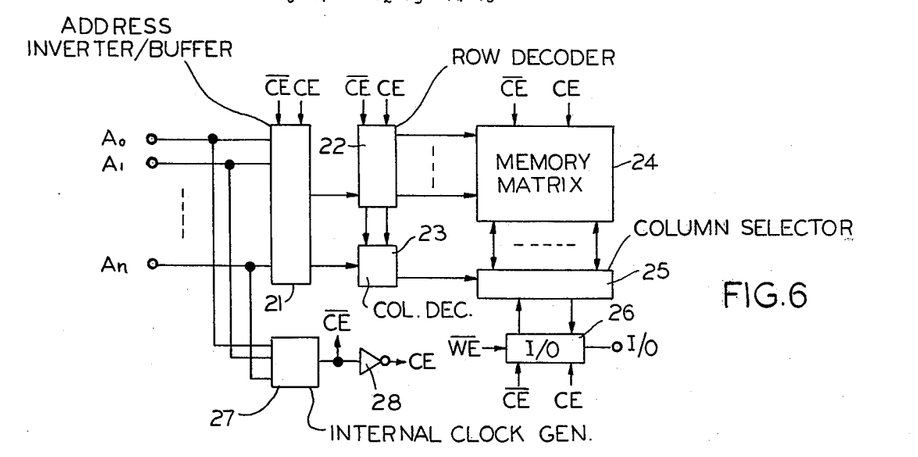
FIG. 6 is a block diagram showing a memory device according to a second preferred embodiment of the present invention.

In FIG. 6 an internal synchronous type memory circuit is composed of an address inverter/buffer circuit 21, a row decoder circuit 22, a column decoder circuit 23, a memory cell array 24, a column selection circuit 25 an input/output circuit 26, an internal clock generator circuit 27 and an inverter 28. An internal clock signal $\overline{CE}$ generated by the internal clock generator circuit 27 and an inverted clock signal CE are fed to the above-referred respective circuits. The internal clock generator circuit 27 is constructed in such manner that as shown in FIG. 2, the address inputs $A_0, A_1, \ldots, A_n$ are respectively fed to one inputs of the respective ones of the Exclusive OR circuits $EX_0, EX_1, \ldots, EX_n$ and to the respective inputs of the delay circuits $D_0, D_1, \ldots, D_n$. The outputs $DA_0, DA_1, \ldots, DA_n$ of the delay circuits $D_0, D_1, \ldots, D_n$ are fed to the other inputs of the respective ones of the Exclusive OR circuits $EX_0, EX_1, \ldots, EX_n$, and the respective outputs $OS_0, OS_1, \ldots, OS_n$ of the respective ones of the exclusive OR circuits $EX_0, EX_1, \ldots, EX_n$ are supplied to the OR circuit RG. The internal clock signal $\overline{CE}$ is output from the OR circuit RG. In the second preferred embodiment, the internal clock signal $\overline{CE}$ is used as a reset signal, while the inverted internal clock signal CE is used as an enable signal. Therefore, in the followings, the internal clock signals $\overline{CE}$ and CE are respectively referred to as "reset signal" and "enable signal".

Figure 7:
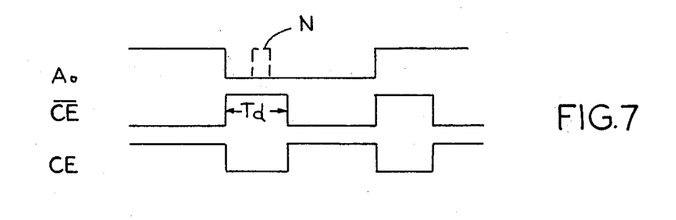
FIG. 7 is a waveform diagram showing one example of operation of the memory device in FIG. 6.
Figure 8:
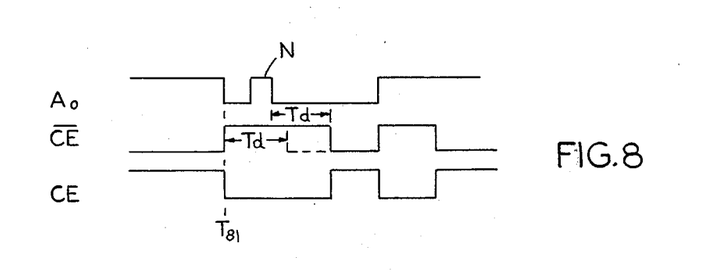
FIG. 8 is a waveform diagram showing another example of the operation of the memory device in FIG. 6.

Now operations of the circuit shown in FIG. 6 will be described, by way of example, in connection to the case where the address input $A_0$ has made its logic change. As shown in FIG. 7, in response to the logic change of the address input $A_0$, a reset signal $\overline{CE}$ is generated. At the same time, the enable signal CE takes a low level and thus the memory circuit is brought into a reset condition. After the present condition has continued for a predetermined period $T_d$ determined by the delay circuit in the circuit 27, the reset signal $\overline{CE}$ takes a low level. At the same time, the enable signal CE changes to a high level, and hence the memory circuit is brought into an enable condition. Here let us assume that a noise N arises in the address input $A_0$ as shown by a broken line in FIG. 7. A timing diagram in this particular instance is illustrated in FIG. 8. Since the reset signal $\overline{CE}$ is turned to a high level each time the address input makes its logic change as described above. In case that a noise N is generated before a predetermined period $T_d$ elapses from time point $T_{81}$ when the address input $A_0$ made its logic change. Then the reset signal $\overline{CE}$ generated at time point $T_{81}$ further sustain the high level condition, and it turns to a low level when the predetermined period $T_d$ has elapsed after disappearance of the noise N. In other words, for a predetermined period $T_d$ after the disappearance of the noise N, the memory circuit is held in a reset condition. Accordingly, by appropriately presetting this reset period $T_d$, it is possible to prevent the memory circuit from being affected by the noise.

While description has been made above in connection to the case where a noise N as shown in FIGS. 7 and 8 has occurred in the address input $A_0$, it is obvious that a noise having whatever delay and whatever width may arise in any one or plurality of address inputs, the memory circuit according to the present invention can operate correctly.

Description has been made to the cases where the present invention is applied to the memory devices. However, the application of the subject matter of the present invention, especially the internal clock generator, is not limited to memory devices but can be expanded to a logic integrated circuit implementing digital operations. In the following the logic circuit according to the present invention will be described with reference to FIGS. 9 to 11, in which description will be made on an address inverter employed in part of the address inverter/buffer circuit in the memory device as one example, which will also clarify another basic effect and advantage of the present invention in addition to the above-described effect and advantage.

In general, in a logic circuit an output would change dependent on whether an input signal exceeds a certain value, and this certain value is called "threshold value". However, the rate of the change in the output to the change in the input in the neighborhood of the threshold value is generally not infinity, but there exists a transient region having a certain width. In other words, when the input signal is in this transient region, the output of the logic circuit is not at the logic level i.e., logic "1" or logic "0". In this mean, the aforementioned transient region shall be called "insensitive region" with respect to an output throughout this specification. If an output of a logic circuit is not at logic level, then the logic circuit cannot achieve its inherent logic functions. Moreover if such condition should continue for a predetermined period, sometimes inconvenience would occur such that an abnormal current flows through the circuit or the logic condition is reversed to a wrong side. Therefore, in such a case, it was necessary to impose restriction upon the input of the logic circuit that it must not stay in the insensitive region longer than a predetermined period. This will be explained in more detail in the followings, by way of example, in connection to an address inverter.

Figures 9, 10, 11, 12, 13:
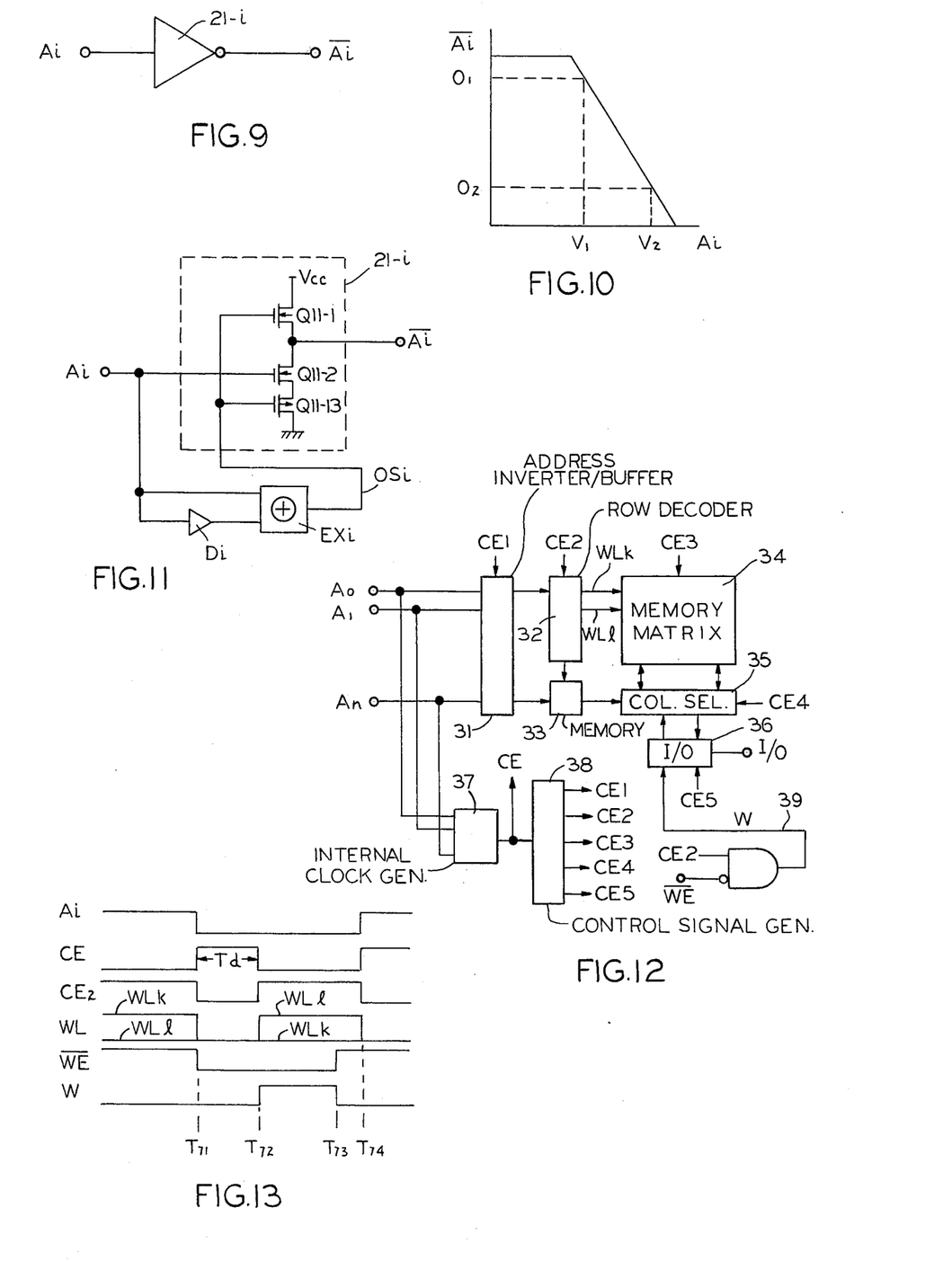
FIG. 9 is a block diagram showing an inverter to be used in an address inverter buffer circuit in the memory device shown in FIG. 6.
FIG. 10 is a diagram showing an input/output characteristic of the inverter shown in FIG. 9.
FIG. 11 is a block diagram showing an inverter and an internal clock generator circuit for one bit of address input according to the present invention.
FIG. 12 is a block diagram showing a memory device according to a third preferred embodiment of the present invention.
FIG. 13 is a waveform diagram showing operations of the memory device in FIG. 12.

An inverter 21-i for one bit in the address inverter/buffer circuit 21 in FIG. 6 is shown in FIG. 9 as one example of a logic circuit. This inverter 21-i generates an inverted output $\overline{A}_i$ in response to an input $A_i$. Input/output characteristics of this inverter 21-i are shown in FIG. 10, in which when the input $A_i$ is outside of an insensitive region $V_1 \sim V_2$, an output $\overline{A}_i$ is either at a first logic level having its minimum value at a level $O_1$ corresponding to logic "1" or at a second logic level having its maximum value at a level $O_2$ corresponding to logic "0". However, when the input $A_i$ is within the insensitive region $V_1 \sim V_2$, the output $\overline{A}_i$ is between the minimum value $O_1$ of the first logic level and the maximum value $O_2$ of the second logic level, that is, the output $\overline{A}_i$ is not at the logic level. Accordingly, in case that the input $A_i$ makes its logic change in a relatively slow manner and stays long in the insensitive region, the output $\overline{A}_i$ would remain in the non-logic level $O_1 \sim O_2$ for that long period.

Now a circuit for obviating the above-described disadvantage of logic circuits by making use of an internal clock generator circuit according to the present invention, will be described, by way of example, in connection to an inverter 21-i with reference to FIG. 11.

A circuit shown in FIG. 11 comprises an address inverter 21-i and an internal clock generator circuit including a delay circuit and an Exclusive OR gate $EX_i$ which responds to the same address input $A_i$ as that applied to the address inverter 21-i. When an input $A_i$ is in an insensitive region $V_1 \sim V_2$ with respect to an inverter output $\overline{A}_i$, the output $\overline{A}_i$ cannot logically take a reliable value and cannot be utilized in a following stage of circuit (not shown). According to the present invention, such falling in insensitive region of $A_i$ can be detected by the internal clock signal generator. An output $OS_i$ of the internal clock signal generator is supplied to an N-channel insulated-gate field-effect transistor $Q_{11-1}$ and a P-channel transistor $Q_{11-3}$. The transistor $Q_{11-1}$ acts as a load element of the inverter 21-i and the transistor $Q_{11-3}$ coupled between a source of an N-channel insulated-gate field-effect transistor $Q_{11-2}$ as a drive transistor and a ground potential is used to reset the inverter 21-i so that the state of the input $A_i$ is inhibited to effect the output $\overline{A}_i$.

As described above, in such a logic circuit, when the input is not at the logic levels, a detection output for notifying the fact is delivered, hence by making use of the detection output it is possible to prevent occurrence of inconvenience such that any device or circuit to which the logic signal is to be applied is forcibly returned to its reset condition. Accordingly, there is no need to impose restriction upon a logic circuit such that its input must not stay for more than a predetermined period.

While a method for overcoming the disadvantage with respect to an insensitive region of a logic circuit has been proposed and explained above, by way of example, in connection to an inverter circuit, it is obvious that the proposed method is also applicable to logic circuits having different functions.

In general, a logic circuit can be formed of NAND circuits or NOR circuits, and especially logic circuits constructed in an integrated circuit from are in most cases constructed of the aforementioned two basic circuits. Obviously, the above discussion with respect to an inverter circuit is equally applicable to these two basic circuits, i.e., a NAND circuit and a NOR circuit. Thus description has been made above in connection to the method for presetting an insensitive region at a desired value.

Now a third preferred embodiment of the present invention will be described with reference to FIGS. 12 and 13.

Generally in a write cycle of an asynchronous type memory circuit not employing an external clock signal, a time from logic change of an address input to input of an externally applied write signal (external write signal) is prescribed, and normally this is called "address set-up time $t_{AS}$". This implies that in order to prevent wrong writing at an address selected in a cycle preceding to the write cycle in question, there is provided a predetermined restriction in time such as, for example, a delay time between an address input and an external write signal so that an internal write signal corresponding to the external write signal $\overline{WE}$ may arise after the word line or bit line corresponding to the previously selected address has become unselected. However, the above-mentioned delay time would largely vary due to fluctuation in manufacture, variation of a power supply voltage and the like, and hence it is necessary to design the circuit with a sufficient margin for the variations. Therefore, this type of memory circuit in the prior art had the disadvantages that not only the estimation of the margin was in itself difficult, but also the width of the internal write signal was shortened by incorporating the margin, thus reliable writing became difficult and high speed operations became difficult. According to the illustrated embodiment, there is provided a memory circuit in which the aforementioned disadvantages relating to the address set-up time $t_{AS}$ are eliminated and there is no need to incorporate the margin for the fluctuations in manufacture and the like.

In FIG. 12, the memory circuit comprises an address inverter buffer circuit 31, a row decoder circuit 32, a column decoder circuit 33, a memory cell array 34, a column selection circuit 35, an input/output circuit 36, an internal timing generator circuit 37, a drive timing generator circuit 38 and an internal write signal generator circuit 39. The internal clock generator circuit 37 generates an internal clock signal CE when logic change occurs in at least one of the address inputs $A_0$ to $A_n$ or when at least one of the address inputs is not at the rated logic levels. The control signal generator circuit 38 responds to the internal clock signal CE for generating a plurality of control signals CE1 to CE5 which are adapted for the control of the operations of the respective functional circuits as "enable signals". A control signal CE2 is used for synchronizing the external write signal $\overline{WE}$, and it is input to the internal write signal generator circuit 39. The internal write signal generator circuit 39 generates an internal write signal W which actually achieves write instruction within the memory circuit. The internal clock generator circuit 37 is equivalent to the circuit shown in FIG. 2 or FIG. 4.

Now the operation of the memory circuit shown in FIG. 12 will be described with reference to a timing chart illustrated in FIG. 13. When a row address input $A_i$ changes at time point $T_{71}$, an internal clock signal CE is turned to a high level and it is turned to a low level at time point $T_{72}$ after a predetermined period $T_d$. A control timing signal CE2 for the row and column address decoder circuits 32 and 33 is held at a low level for the period $T_d$ from time point $T_{71}$ to time point $T_{72}$ to bring the address decoder circuits 32 and 33 to a reset condition, and it rises to a high level at time point $T_{72}$ to turn the address decoder circuits 32 and 33 to an enable condition. In response to such change in condition, word lines $WL_k$ and $WL_l$ are both at a low level when the address decoder circuits 32 and 33 are in the reset condition, and at time point $T_{72}$ a selected word line $WL_j$ takes a high level. On the other hand, the external write $\overline{WE}$ that was applied at time point $T_{71}$ can be converted into an internal write signal W and introduced into the memory circuit for the first time when the control signal CE2 takes a high level at time point $T_{72}$. Consequently, at time point $T_{72}$ it becomes possible to write in a selected memory cell. When the external write signal $\overline{WE}$ takes a high level at time point $T_{73}$, the internal write signal W is turned to a low level, and then the write enable condition is terminated.

As will be apparent from the above description, since the internal write signal W is generated in synchronism with the control signal CE2 which controls the address decoder circuits 32 and 33, it would never occur that data are written into the preceeding address which was selected in the previous cycle. In other words, the requirement for the address setup time $t_{AS}$ could be logically fulfilled, and so there is no need to provide a margin in design for the fluctuations in manufacture, variations of a power supply voltage and the like.

Figure 14:
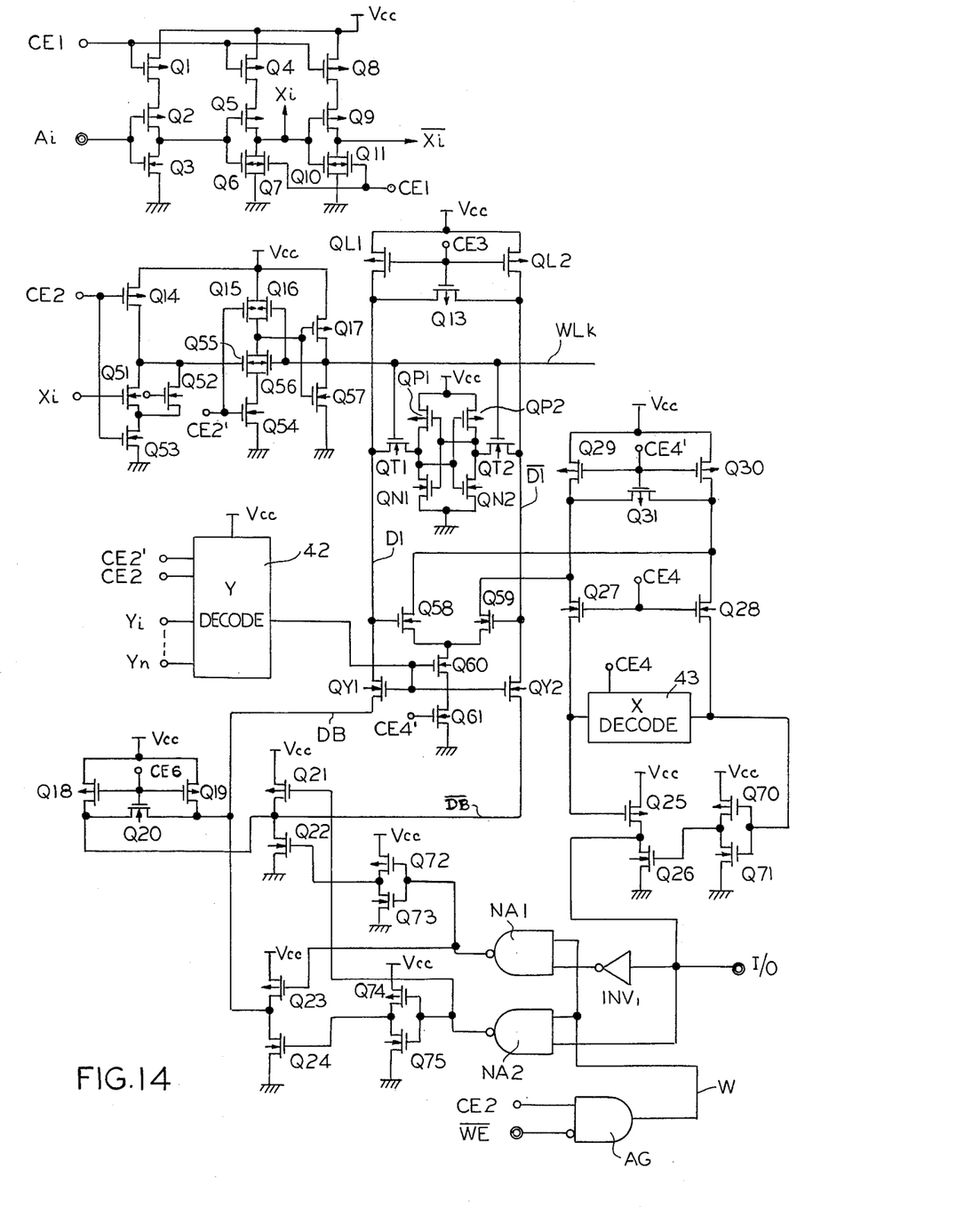
FIG. 14 is a circuit diagram showing a detailed circuit arrangement in a memory device according to the present invention.

Now a detailed circuit arrangement for embodying the present invention will be described with reference to FIGS. 14 to 16. In the practical example of the memory circuit shown in FIG. 14, a C-MOS structure employing P-channel insulated-gate field-effect transistors (IGFETs) and N-channel IGFETs is illustrated. In this circuit, an X-address inverter/buffer circuit includes P-channel IGFETs $Q_1$, $Q_2$, $Q_4$, $Q_5$, $Q_8$ and $Q_9$ and N-channel IGFETs $Q_3$, $Q_6$, $Q_7$, $Q_{10}$ and $Q_{11}$ constituting three stages of inverters. When a control signal CE1 is at a low level, this address inverter/buffer circuit is in a reset condition, and it is brought into an enable condition when the control signal CE1 is turned to a high level. A X-decoder includes P-channel IGFETs $Q_{14}$ to $Q_{17}$ and N-channel IGFETs $Q_{51}$ to $Q_{57}$. In this X-decoder, a control signal CE2 is applied to the gates of the IGFETS $Q_{14}$ and $Q_{53}$, and when this control signal CE2 is at a low level, these transistors are conducted for resetting a NOR circuit including IGFETs $Q_{51}$ and $Q_{52}$, as dynamic type load elements. Also in the X-decoder, P-channel IGFETs $Q_{15} \sim Q_{17}$ and N-channel IGFETs $Q_{54} \sim Q_{57}$ constitute a flip-flop type latch circuit which is reset in response to a low level of a control timing signal CE2' and enabled in response to its high level. Thus, the X-decoder circuit shifts to its enable state through its reset state caused by the signals CE2,CE2'. In this connection, the signal CE2' may be replace by the signal CE2.

As described above, in the illustrated embodiment, the circuits are constructed in such manner that the respective signals CE1 and CE2 are complementarily utilized on the side of the circuit elements instead of providing complementary signals $\overline{CE1}$ and $\overline{CE2}$.

Each memory cell is composed of P-channel IGFETs $Q_{P1}$ and $Q_{P2}$ and N-channel IGFETs $Q_{N1}$ and $Q_{N2}$, and in each memory cell a pair of cross coupled points are connected to a pair of digit lines $D_1$ and $\overline{D_1}$ via N-channel IGFETs $Q_{T1}$ and $Q_{T2}$, respectively, which serve as transfer gates with their gates connected in common to associated one word line $WL_k$. These digit lines $D_1$ and $\overline{D_1}$ are held in a reset condition, that is, precharged by P-channel IGFETs $Q_{L1}$, $Q_{L2}$ and $Q_{13}$ during the period when a control signal CE3 at a low level.

P-channel IGFETs $Q_{29}$ to $Q_{31}$ and N-channel IGFETs $Q_{58}$ to $Q_{61}$ from a selection sense amplifier, which is held in a reset condition during the period when the control signal CE4' is at a low level, and which is held in an enable condition during the period when the control signal CE4' is at a high level.

A Y-decoder 42 has a similar circuit structure as the X-decoder, and it is rest when the control signals CE2 and CE2' at a low level and is held in an enable condition when the control signals CE2 and CE2' are at a high level. In an enable condition, the Y-decoder 42 controls Y-select IGFETs $Q_{60}$, $Q_{Y1}$ and $Q_{Y2}$.

An output latch circuit 43 reaches the output of the sense amplifier via N-channel IGFETs $Q_{27}$ and $Q_{28}$, and in response to a high level of a control signal CE4 it holds the output and drives a push-pull type output circuit consisting of P-channel IGFETs $Q_{25}$ and $Q_{26}$ to feed the output to an input/output terminal I/O.

P-channel IGFETs $Q_{18}$ to $Q_{20}$ have a reset function for the write circuit, and they precharge write bus lines DB and $\overline{DB}$ in response to a control signal CE5 at a low level. NAND gates $NA_1$ and $NA_2$ and P-channel IGFETs $Q_{21}$ to $Q_{24}$ form a write drive circuit, which operates in such manner that when the control signal CE5 is at a high level, in response to a high level of an internal write signal W produced by AND gate AG receiving the signal CE2 and the write signal $\overline{WE}$ the data at the input/output terminal I/O may be applied in a complementary form to the write bus lines $\overline{DB}$ and DB through two push-pull type inverters, respectively.

Figure 15:
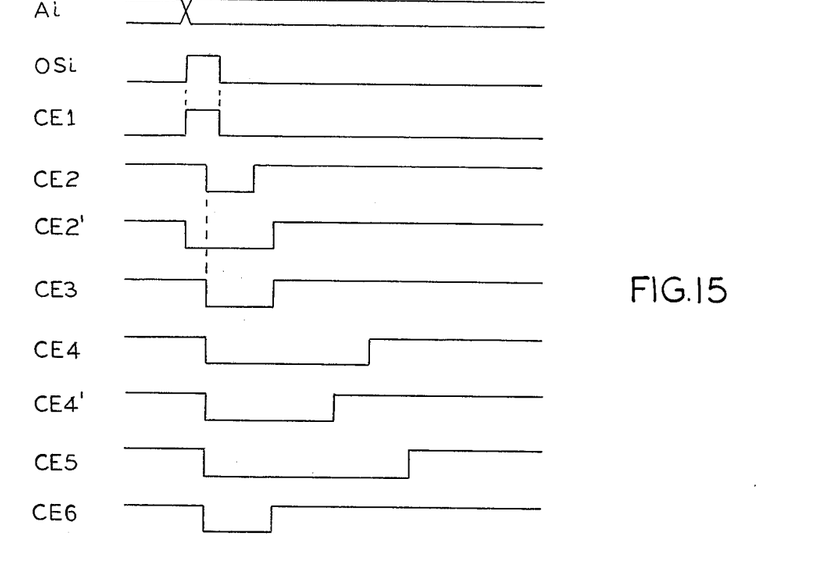
FIG. 15 is a waveform diagram showing various control signals used in the circuit shown in FIG. 14.
Figure 16:
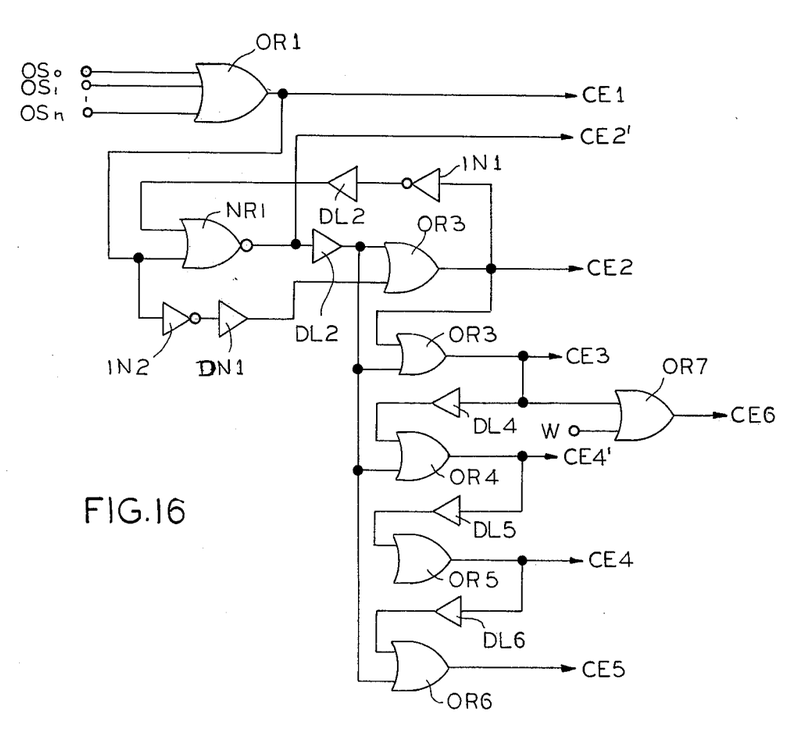
FIG. 16 is a block diagram showing a control timing generator circuit.

In FIG. 15 is illustrated one example of timing relationship between the internal clock signal $OS_i$ generated in response to change of the address and the respective control signals CE1 to CE5 which are generated on the basis of the signal $OS_i$ caused by address input change ($A_i$) through a well-known process and which are adapted to the respective functional circuits. Then the data output (at the terminal I/O) would be data accessed after termination of resetting of the respective functional blocks.

In the illustrated embodiment, since a C-MOS structure is employed, the respective functional circuits can be controlled substantially by means of a single control signal. In addition, stationary currents flowing through the respective functional blocks can be greatly reduced.

Next, a circuit for generating the respective control signals CE1 to CE5 as appearing in FIGS. 14 and 15 will be described with reference to FIG. 16. An OR gate $OR_1$ is enactly the same as the OR gate R in FIG. 2 and address change detection outputs $OS_0$ to $OS_n$ for the respective address inputs $A_0$ to $A_n$ are input to this OR gate $OR_1$. The control signal CE1 is derived from the output of the OR gate $OR_1$. The other control signals CE2 to CE6 are derived from the control signal CE1 through a circuit consisting of a NOR gate $NR_1$, OR gates $OR_2$ to $OR_7$, inverters $IN_1$ and $IN_2$ and delay circuits $DL_1$ to $DL_6$ as shown in FIG. 16. The control signal CE6 is generated only upon write operation.

In the above description, the delay circuit ($D_0 \sim D_n$) and the Exclusive OR gate ($EX_1 \sim E_n$) are employed in the internal clock (timing) signal generator circuit. However, the internal clock signal generator circuit according to the present invention is not limited to such a structure.

In the following, another example of the internal clock signal circuit will be described with reference to FIGS. 17 and 18.

Figure 17:
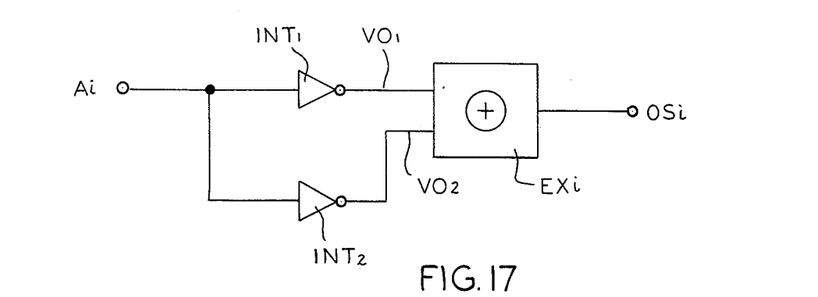
FIG. 17 is a block diagram showing another example of the internal clock signal generator circuit.
Figure 18:
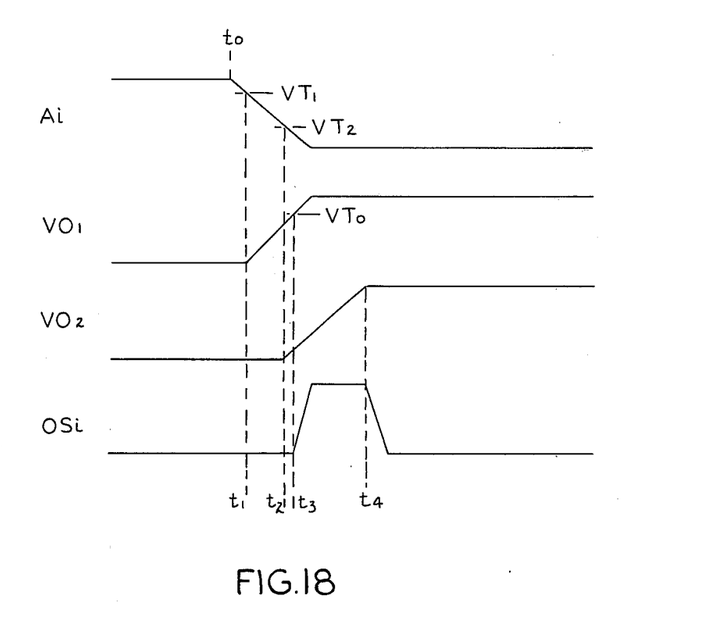
FIG. 18 is a wave form diagram showing operation of the circuit of FIG. 17.

In FIG. 17, one bit unit of structure for the circuit for detecting a change in the input $A_i$ in logic level or nonlogic level of the input $A_i$ is illustrated. In this scheme, an inverter circuit $INT_1$ having a logic threshold value $V_{T1}$ and an inverter circuit $INT_2$ having a logic threshold value $V_{T2}$ are coupled between the input $A_i$ and the respective input terminals of the Exclusive OR circuit $EX_i$. The threshold value $V_{T1}$ is at a voltage near the high level of the input signal $A_i$ and a slightly smaller voltage than it. The threshold voltage $V_{T2}$ is at the low level of the input signal $A_i$ and slightly larger than it. In this structure, the transient in the input signal $A_i$, i.e. the non-logic level thereof can be detected based on a difference of the threshold values $V_{T1}$ and $V_{T2}$.

Operation of the circuit in FIG. 17 will be described with reference to FIG. 18.

From time point $t_0$, the level of the input signal $A_i$ starts to fall from the high-level to the low level. At time point $t_1$, the level of the signal $A_i$ becomes lower than the threshold value $V_{T1}$ and an output $VO_1$ of the inverter $INT_1$ starts to rise while an output $VO_2$ of the inverter $INT_2$ remains at the low level. Then, at time point $t_2$, the level of the signal becomes lower than the threshold value $V_{T2}$ and hence the output $VO_2$ starts to rise. The rising level of the output $VO_1$ exceeds a threshold value $V_{T0}$ of the Exclusive OR gate $EX_i$ and hence the output $OS_i$ starts to rise in level. Then at time point $t_4$, the output $VO_2$ reaches the high level and hence the output $OS_i$ starts to fall. Thus, the detection signal ($OS_i$) is generated based on the change in the signal $A_i$.

Now a method for presetting the threshold voltage at any desired value will be explained. At first, let us consider an inverter circuit. Input/output characteristics of an inverter circuit in the proximity of the insensitive region are represented by the following equation (1):

$$V_{OUT} - V_O = -m(V_{IN} - V_T) \quad (1)$$

where $V_{OUT}$ represents an output, $V_{IN}$ an input, m a gain, $V_0$ a center value of a non-logic level, and $V_T$ represents an input value corresponding to $V_0$, that is, a threshold value. Thus the threshold value in this instance can be arbitrarily preset by appropriately selecting the respective threshold voltages and the gm ratios of the IGFETs forming the inverter. In addition, input-/output characteristics of inverter circuits as cascaded in n stages as a whole are represented by the following equations (2) and (3):

$$V_{OUT} - V_o = \left\{ (-1)^n \prod_{i=1}^{n} m_i \right\} (V_{IN} - V_T) \quad (2)$$

$$V_T = V_1 - \sum_{k=2}^{m} \frac{V_o - V_k}{(-1)^{k-1} \prod_{i=1}^{k-1} m_i} \quad (3)$$

where $m_i$ represents a gain of the i-th inverter, and $V_k$ represents a threshold value of the k-th inverter. In this case also, the insensitive region can be arbitrarily preset according to equations (2) and (3) above by appropriately relating the characteristics of the individual inverters. Therefore, the inverter circuit such as $INT_1$, $INT_2$ having optional threshold voltage can be realized base on the equation (3).

I claim:

1. A memory device comprising input means for receiving a plurality of input address signals having first and second logic levels, a plurality of memory cell means, access means responsive to said input address signals for selectively accessing said memory cell means, a plurality of detection circuit means, each of said detection circuit means detecting when the associated address signal takes an insensitive level between said first and second logic levels, each of said detection circuit means including a first inverter circuit means having a first threshold voltage corresponding to an upper value of said insensitive level, said first inverter circuit means receiving the associated input address signal, second inverter circuit means having a second threshold voltage corresponding to the lower value of said insensitive level, said second inverter circuit means receiving said associated input address signal, Exclusive OR circuit means receiving output signals of said first and second inverter circuit, and means responsive to an output signal of at least one of said Exclusive OR circuit means for operatively resetting said access means, whereby the operation of said access means is inhibited when at least one of said address signals takes said insensitive level.

2. A semiconductor memory device comprising means for receiving a plurality input address signals having first and second logic levels, a plurality of memory cell means arrayed in a matrix form of rows and columns, decoder means responsive to a first portion of said input address signals for operatively selecting one of said rows, selection means responsive to a second portion of said address signal for operatively selecting one of said columns, detection means for detecting when at least one of said input address signals takes an intermediate level which is higher than said first logic level and lower than said second logic level, said detection means generating a detection signal only when at least one of said input address signals takes said intermediate level, and means responsive to said detection signal for generating a first control signal for controlling the operation state of said decoder means.

3. The memory according to claim 2, in which said detection means includes first means having a first threshold voltage, second means having a second threshold voltage which is higher than said first threshold voltage, both said first and second means receiving the same input address signal, and third means for detecting when said address signal has a voltage which is higher than said first threshold voltage and lower than said second threshold voltage, whereby said intermediate level of the address signal is detected by said third means.

4. The memory device according to claim 2, further comprising means responsive to said detection signal for generating a second control signal, means for receiving a write control signal, means for receiving a write data signal, means for substantially synchronizing said write control signal with said second control signal to produce an inner write signal, and means responsive to said inner write signal for writing said write data signal into one of said memory cell means.

5. The memory according to claim 2, in which each of said memory cell means includes both N-channel insulated-gate field-effect transistors and P-channel insulated-gate-field-effect transistors.

6. The memory device according to claim 2, in which said access means is enabled through its reset state in response to said first control signal.

7. The memory device according to claim 2, in which said detection means includes a plurality pairs of inverter circuit members, each pair of said pairs of inverter circuit means including a first inverter circuit means having a first value of threshold voltage and a second inverter circuit means having a second value of threshold voltage, said first value being different from said second value, said first and second inverter circuit means having a common input for receiving one of said input address signals, and a plurality of Exclusive OR gate means, each of said Exclusive-OR gate means receiving a pair of outputs of an associated one pair of said pairs of inverter circuits.

8. An integrated circuit comprising logic circuit means having an input terminal, means for supplying said input terminal with a logic signal having first and second binary logic levels, detection means for detecting when said logic signal takes an insensitive level between said first and second logic levels, said insensitive level being unclassifiable into binary logic levels for said logic circuit, signal means responsive to said detection means for producing a control signal, and means responsive to said control signal for forcibly setting an output of said logic circuit at a predetermined state.

9. The integrated circuit according to claim 8, in which said detection means includes first means having a first threshold voltage, second means having a second threshold voltage which is different from said first threshold voltage, both of said first and said second means receiving said binary logic signal at their inputs, and means for comparing the output of said first means with the output of said second means, said comparing means generating an output signal when the output of said first means does not substantially coincide with the output of said second means.

10. A memory integrated circuit comprising input means for receiving a plurality of input address signals, a plurality of memory cell means, access means for selectively accessing said memory cell means, means for receiving a write command signal, means for receiving a write data signal which is not classified into binary logic levels, detection means for detecting non-logic level in said input address signals, said non-logic levels being non-classifiable into said binary logic levels, signal means responsive to an output of said detection means for producing a control signal, means for substantially synchronizing said write command signal with said control signal to produce an inner command signal, means for resetting said access means substantially in response to said control signal, and means responsive to said inner command signal for writing said write data signal into one of said memory cells.

* * * * *